United States Patent
Woodworth et al.

(10) Patent No.: US 6,476,481 B2
(45) Date of Patent: Nov. 5, 2002

(54) HIGH CURRENT CAPACITY SEMICONDUCTOR DEVICE PACKAGE AND LEAD FRAME WITH LARGE AREA CONNECTION POSTS AND MODIFIED OUTLINE

(75) Inventors: Arthur Woodworth, Surrey (GB); Peter R. Ewer, Surrey (GB); Ken Teasdale, Temecula, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 09/103,035

(22) Filed: Jun. 23, 1998

(65) Prior Publication Data

US 2001/0054752 A1 Dec. 27, 2001

Related U.S. Application Data

(60) Provisional application No. 60/084,224, filed on May 5, 1998.

(51) Int. Cl.[7] .................. H01L 23/495; H01L 23/02; H01L 21/44

(52) U.S. Cl. .................. 257/696; 257/666; 257/784; 257/786; 257/787; 257/775; 257/698; 257/676; 257/692; 257/693; 257/684; 257/796; 361/813; 29/827; 174/52.2; 174/52.4

(58) Field of Search .................. 257/666, 684, 257/668, 675, 670, 712, 713, 796, 784, 786, 731, 696, 698, 692, 693, 690, 676, 775, 787; 174/52.4, 52.2; 361/813; 29/827

(56) References Cited

U.S. PATENT DOCUMENTS

| | | | |
|---|---|---|---|
| 3,781,613 A | * | 12/1973 | Robinson |
| 3,784,884 A | * | 1/1974 | Zoroglu |
| 4,346,396 A | * | 8/1982 | Carroll, II et al. .......... 257/674 |
| 4,546,374 A | * | 10/1985 | Olsen et al. ................ 257/772 |
| 4,617,585 A | * | 10/1986 | Yasui .......................... 257/796 |
| 4,649,637 A | * | 3/1987 | Hatakeyama ................ 29/827 |
| 4,827,329 A | * | 5/1989 | Schach et al. .............. 257/796 |
| 4,950,427 A | * | 8/1990 | Endo ........................... 257/719 |

(List continued on next page.)

FOREIGN PATENT DOCUMENTS

| | | |
|---|---|---|
| JP | 61016554 | 1/1986 |
| JP | 1143143 | 2/1989 |
| JP | 1216608 | 8/1989 |
| JP | 2087535 | 3/1990 |

OTHER PUBLICATIONS

Office Action issued by the Japanese Patent Office on Feb. 22, 2000 in the corresponding Japanese application along with an English translation thereof.

*Primary Examiner*—Alexander O. Williams
(74) *Attorney, Agent, or Firm*—Ostrolenk, Faber, Gerb & Soffen, LLP

(57) ABSTRACT

A lead frame for a high power semiconductor device die has three external lead conductors, the outer two of which are reentrantly bent outwardly from the center of the lead frame. When the lead frame is overmolded, the outer conductors are spaced from a central conductor by an increased creepage distance along the plastic surface of the housing. Further, the lead sequence of the exterior leads is gate, source, drain for a power MOSFET. The post area for wire bonding to the source post is enlarged to permit wire bonding with at least three bond wires. The external conductors can be downwardly bent to form a surface mount device. The cross-sectional area of the external conductors is substantially enlarged, although only a small enlargement of the circuit board hole is needed. The package outline has a long flat area centered over the main die area, with a tapered end surface which allows the package to pry open a mounting spring for surface mounting of the package.

5 Claims, 8 Drawing Sheets

U.S. PATENT DOCUMENTS

| | | | | |
|---|---|---|---|---|
| 5,038,200 A | * | 8/1991 | Hosomi et al. | 257/796 |
| 5,113,240 A | * | 5/1992 | Bozzini et al. | 257/689 |
| 5,229,918 A | * | 7/1993 | Bosca et al. | 361/710 |
| 5,291,178 A | * | 3/1994 | Strief et al. | 338/226 |
| 5,309,027 A | * | 5/1994 | Letterman, Jr. | 257/796 |
| 5,309,460 A | * | 5/1994 | Fujimaki et al. | 372/36 |
| 5,434,449 A | * | 7/1995 | Himeno et al. | 257/690 |
| 5,444,294 A | * | 8/1995 | Suzuki | 257/666 |
| 5,557,842 A | * | 9/1996 | Bailey | 29/827 |
| 5,563,441 A | * | 10/1996 | Kato | 257/666 |
| 5,587,608 A | * | 12/1996 | Meng | 257/712 |
| 5,767,567 A | * | 6/1998 | Hu et al. | 257/666 |
| 5,814,884 A | * | 9/1998 | Davis et al. | 257/723 |
| 5,825,794 A | * | 10/1998 | Ogino et al. | 257/99 |
| 5,917,704 A | * | 6/1999 | Trublowski et al. | 361/705 |
| 5,977,630 A | * | 11/1999 | Woodworth et al. | 257/712 |
| 6,335,548 B1 | * | 1/2002 | Roberts et al. | 257/98 |

* cited by examiner

HIGH CURRENT CAPACITY SEMICONDUCTOR DEVICE PACKAGE AND LEAD FRAME WITH LARGE AREA CONNECTION POSTS AND MODIFIED OUTLINE

RELATED APPLICATIONS

This application claims priority of Provisional Applications Serial Nos. 60/084,224, filed May 5, 1998.

BACKGROUND OF THE INVENTION

This invention relates to a high power semiconductor device lead frame and package containing enlarged connection posts and conductors with a novel lead sequence and having an increased dielectric creepage distance between adjacent leads and having a modified outline.

Semiconductor devices such as diodes, thyristors, MOS-gated devices such as MOSFETs, IGBTs and the like are commonly formed in a silicon semiconductor die containing the device junctions. The die have metallized bottom drain or other power electrodes and have source and gate electrodes or other power electrodes on their upper surface. The die are mounted on enlarged conductive lead frame pads and the power electrodes on the upper die surface have connection wires which are wire bonded by plural wires from the conductive electrode area of the die to flat connection post areas which are in turn connected to the exterior lead conductors of the lead frame. These exterior lead conductors extend through a molded housing which overmolds the lead frame and die. The lead frame will contain a plurality of identical sections, for example, 20 or more sections which are simultaneously processed to receive separate die and wire bonds and overmolding. The individual devices are then separated after the molding process. The final device may have well known industry standard package outlines, for example, the well known TO220 or TO247 package outlines.

Known package structures have a current capacity which is limited by the number of parallel bonding wires which can connect the die power electrode, for example, the source electrode of a power MOSFET or the cathode of a diode to a corresponding lead frame post. It would be desirable to arrange the lead frame so that an increased number of parallel bonding wires can be used to reduce package resistance without increasing the size of the package.

Known package structures, particularly for MOSgated devices such as power MOSFETs also conventionally have parallel external lead conductors in a sequence of gate, drain and source. This causes an added spacing between gate and source leads. It would be very useful to have the gate and source leads adjacent to one another, while maximizing the source post area. It would be further desirable to increase the conduction cross-sectional area of the source or other elongated external leads.

In conventional molded housing packages the lead frame conductors extend from the interior of the high dielectric housing to the area exterior of the package. The "creepage" distance along the surface of the package is thus related to the external spacing of the external conductors, and limits the maximum voltage which can be applied between these leads. It would be desirable to increase the creepage distance along the package surface at which the lead frame leads extend out of the package without increasing the size of the package.

Known package structures have lead conductors extending outwardly from the lead frame and through the plastic housing surface. These lead conductors are contentionally rectangular, or V-shaped and are designed to fit into a metallized opening in a printed circuit board. The cross-section of these conductors must be large enough to carry the device current without excessive heating. However, the diameter of the holes in the board is limited, because their spacing is determined by the spacing of the device lead conductors and their conductive bushings. It would be desirable to increase the cross-sectional area of these lead conductors, without excessively increasing the diameter of the holes in the circuit board which receives the conductor.

The present package outline has a relatively thick plastic volume which is joined to a thinner volume by a vertical rise. The thicker region extends from the lead conductor edge of the package to the vertical rise which is located above a central region of the die. The thinner volume extends to the end of the package which is opposite to its output lead conductor side. the vertical rise to the thicker region of the package forms a 90° angle to the top surface of the thicker region. The material within this sharp angle tends to accumulate bubbles in the plastic during molding which leads to device rejections and failure.

Further, when devices of the above outline are to be surface mounted on a support board and held in place by a cantilevered spring, the spring presses atop the surface of the thick plastic region. Consequently, spring pressure is applied at a location which is removed from over the center of the die. It would be desirable to have the point of application of the spring pressure located over the center of the die which is mounted within the package. It would be further desirable to simplify the mounting of the package under a cantilevered spring without requiring special tools.

BRIEF DESCRIPTION OF THE INVENTION

In accordance with a first feature of the invention it is recognized that the area of the drain post and gate post of the lead frame can be smaller than that of the source post and the area then made available can be used to increase the source post area. This makes it possible to use an increased number of bonding wires to bond the die source electrode to the source post of the lead frame, thus increasing the current carrying capacity of the package.

In accordance with another feature of the present invention, a novel lead frame structure is provided in which, for a MOSFET type package for example, the lead frame external lead sequence is changed from the prior art gate, drain, source, to a novel sequence of gate, source, drain. This new sequence improves the application of the device by reducing the spacing between gate and source connections, thus reducing the leakage inductance of the gate circuit. The novel new sequence further makes it possible to increase the area of the source post and to decrease the area of the drain post (which has a very wide area bottom die connection area), and makes it possible to use an increased number of bonding wires from the die source to the lead frame source pad to reduce package resistance without increasing the package size.

A further feature of the invention permits an outward (from the lead frame center) reentrant bend of the two outermost leads from the centermost lead frame lead where the lead conductors exit from the package, without reducing lead conduction cross-section. This outward reentrant bend increases the creepage distance between the outer leads and center lead along the surface of the package insulation to increase the breakdown voltage of the device. By an outward reentrant bend is meant a bend which redirects an elongated conductor to a generally perpendicular path away from the center of the package, and then again redirects the elongated conductor to a path which is parallel, but spaced from its original path.

A further feature of the invention comprises the increase in cross-sectional area of the lead frame external conductors without requiring a significant increase in board hole diameter. Thus, in a first embodiment it was found that making the normally rectangular conductor more square in shape, that a larger area of copper conductor can fit into the same diameter opening. Further, it was found that the use of a slight chamfer of the edges of the rectangular conductor will increase the total cross-section of the final conductor.

As a still further feature of the invention, the plastic package outline is modified so that it has a uniform thickness and flat top exterior surface extending from the lead conductor edge and atop substantially the full area of the interior die. The end wall of the package opposite to the lead conductors is then tapered down toward the package bottom and edge at an angle of about 45° to the vertical.

As a result of this novel structure, when the package is mounted by a cantilevered spring, the center of the spring force against the top of the package can be centered over the center of the die, which is the most efficient location for application of force to the surface mounted device.

Further, the use of the tapered end surface increases the angle between the end surface and top surface to about 135°, thus making it easier to exclude bubbles from this top edge area of the die during molding.

Finally, the tapered end surface of the package, makes it possible to use the package as a wedge, to press the package under the raised lip of a cantilevered spring and under the spring without needing special tools.

DETAILED DESCRIPTION OF THE DRAWINGS

Figure 1:
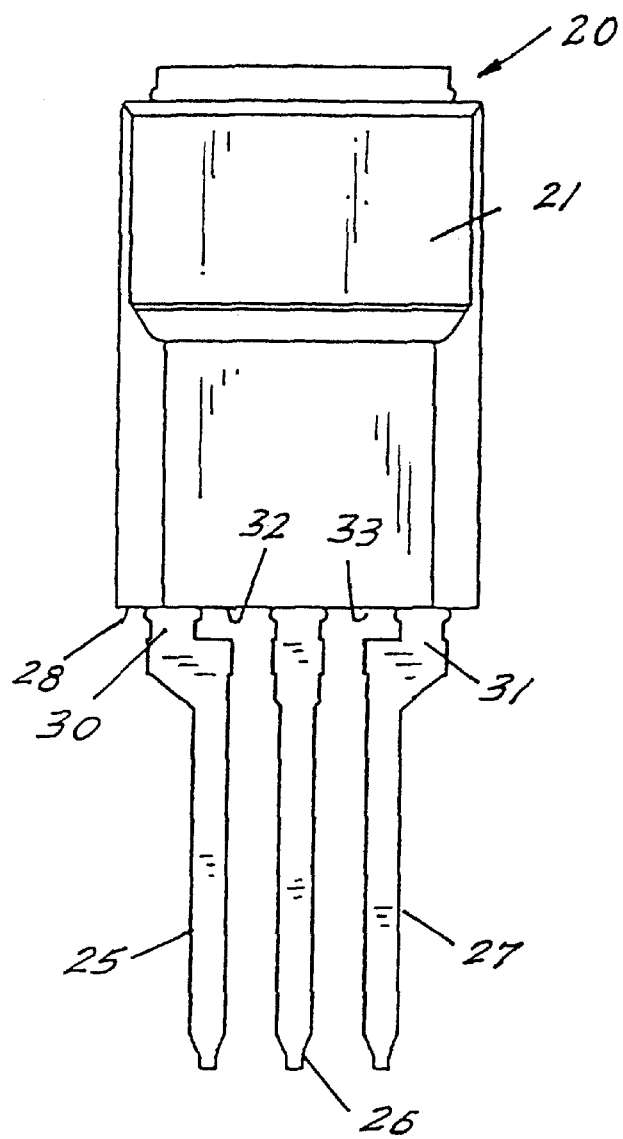
FIG. 1 is a top view of a novel package containing the novel lead frame of the invention.
Figure 3:
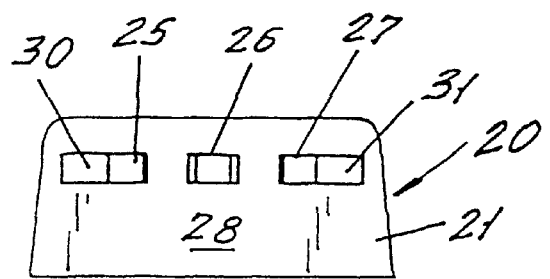
FIG. 3 is an end view of FIG. 1.
Figure 2:
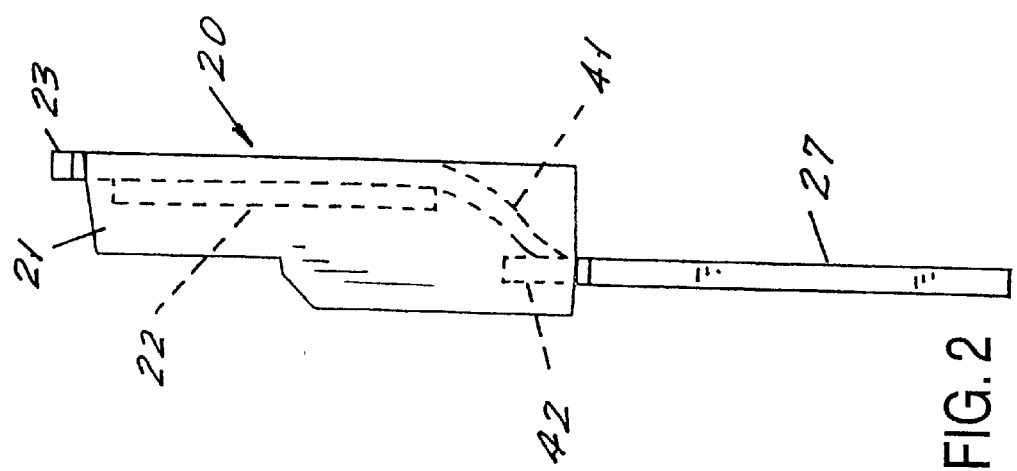
FIG. 2 is a side view of the package of FIG. 1.

Referring first to FIGS. 1, 2 and 3, there is shown a TO220 type semiconductor device package 20 containing certain features of the present invention. Package 20 consists of a conventional plastic molded housing 21, which may be transfer molded, and which encapsulates a semiconductor die 22, shown in dotted lines in FIG. 2. A bottom main conductive lead frame paddle 23 receives the bottom drain electrode of die 22. Three lead conductors 25, 26 and 27 extend through the front wall 28 of plastic housing 21. Leads 25, 26 and 27 can be gate, drain and source contacts respectively for die 22 (if it is a power MOSFET die), or, in accordance with an aspect of the invention to be described, can be gate, source and drain contacts respectively.

In accordance with an important feature of the invention, conductors 25 and 27 are bent away from the center of lead 26 and the package 20 at areas adjacent the front surface 28 by reentrantly shaped bends 30 and 31 respectively. This causes added creepage distances 32 and 33 along surface 28 to permit the use of higher voltages between leads 25 and 27, and center lead 26.

Figure 4:
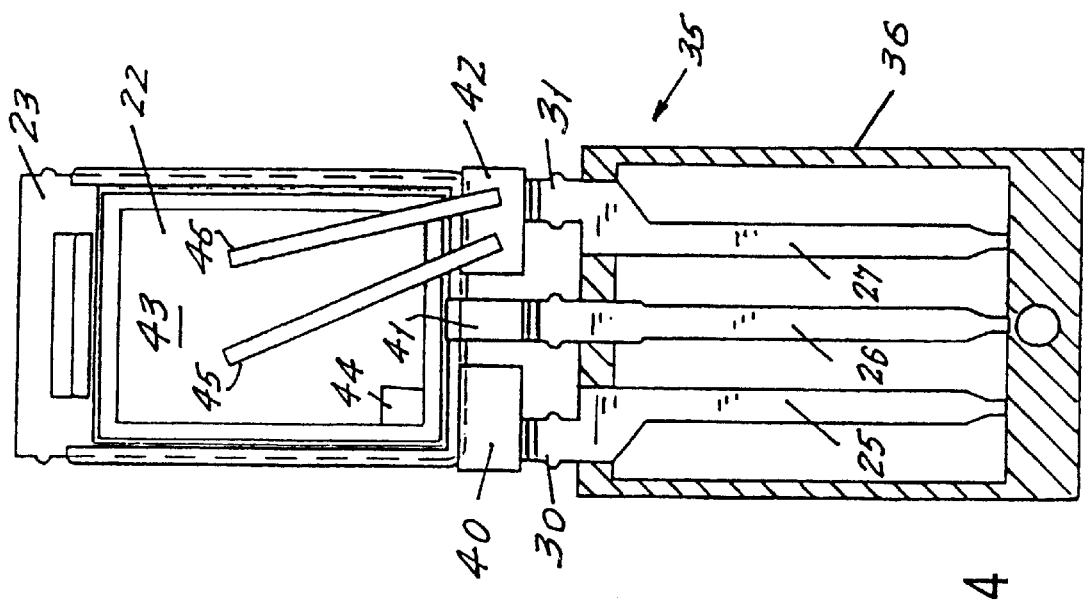
FIG. 4 is a top view of a single section of a lead frame which can be encapsulated in the package of FIGS. 1, 2 and 3, using the novel increased outwardly bent lead conductors to increase creepage distance along the plastic housing surface, and using the known sequence of gate, drain and source lead conductors.

FIG. 4 shows one section 35 of a multisection lead frame which can be used in package 20 of FIGS. 1, 2 and 3. The shaded area 36 shows the sections of the lead frame which are conventionally trimmed away after the overmolding of housing 21 as shown in FIGS. 1 to 3. The paddle section 23 may be of any suitable copper or copper alloy and may have a thickness, for example, of 1.27 mm. The top surface of paddle 23 which receives semiconductor die 22 may be unplated to improve the bonding of the bottom electrode of die 22 (such as the bottom drain of a MOSFET die) to the paddle 23 as by soldering or the like. The remainder of lead frame 35 may be nickel plated.

The portion of the frame 35 containing external lead conductors may also be nickel platted copper and may have a thickness of 0.8 mm. External lead conductors or fingers 25 and 27 terminate in solder posts 40 and 42 respectively, corresponding to gate source connectors respectively. Note that solder posts 40 and 42 are coplanar and are in a plane which is above the plane of the upper surface of paddle 23. Paddle 23 also has an extension 41 which is aligned with and is continuous with conductor 26. Thus, die 22 is provided at its top with a source electrode 43 and a gate electrode 44. Gate electrode 44 is wire bonded to post 40 (which is suspended above and insulated from pad 23), and source electrode 43 is wire bonded to post 42 which is also above and insulated from pad 23 (see FIG. 2). Because of the relatively small area of post 42, only two 20 mil bond wires 45 and 46 can be used to bond source electrode 43 to post 42 (and thus external lead conductor or finger 27 when the excess metal, shown shaded, is stripped away).

Figure 5:
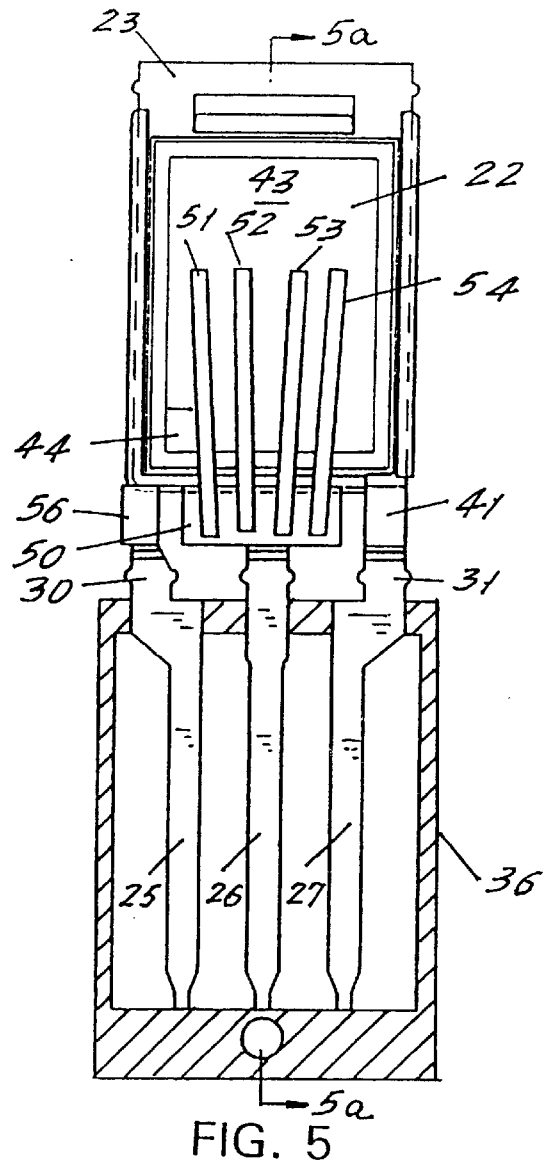
FIG. 5 is a top view of a second embodiment of a lead frame like that of FIG. 4, with the novel lead conductor sequence of gate, source and drain and an increased area source post.
Figure 5A:
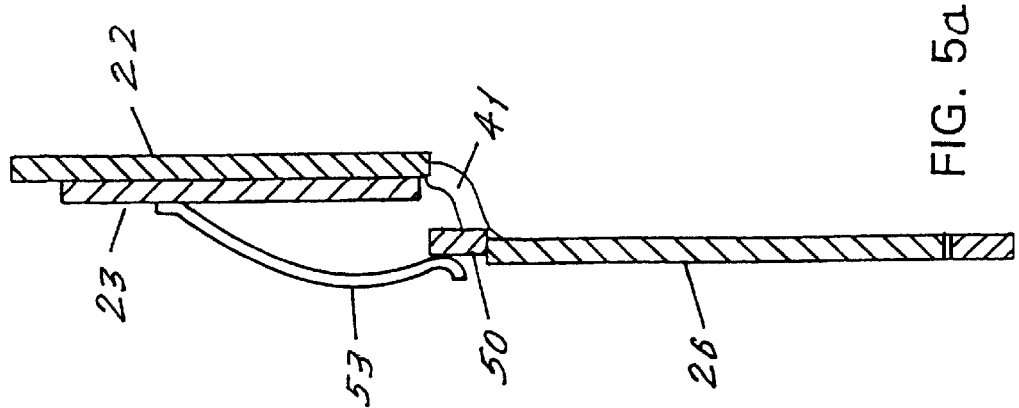
FIG. 5a is a cross-section of FIG. 5 taken across the section lines 5a—5a in FIG. 5.

FIGS. 5 and 5a show another aspect of the invention which permits the use of additional bonding wires to the source electrode 43. Thus, the conductors 25, 26 and 27 are gate, source and drain electrodes respectively, bringing the source and gate conductors closer together as shown in FIG. 5. Further, the source post 50 is now centrally located and is much wider than post 42 in FIG. 4. Significantly, post 50 may be wider than about one-half the width of the lead frame. This enables the use of 4 20 mil bonding wires 51, 52, 53 and 54, each identical to wires 45 and 46 in FIG. 4, from source electrode 43 to post 50 which extends from conductor 26. The use of 4 bond wires instead of 2 permits a significant reduction in package resistance and thus an increase in the current capacity of the package without changing the package size or die size.

The bonding wires 45, 46; and 51 to 54 are preferably pure aluminum wires (0.9999 purity) and 20 mils in diameter. A single wire has a resistance of almost 1 milliohm; two parallel wires have a resistance of about 0.5 milliohms, and 4 wires have a resistance of about 0.25 milliohms. Thus, the use of added wires causes a substantial reduction in package resistance.

The gate post 56, which receives only a thin gate bonding wire is reduced in area, and the pad extension 41 from pad 23 is moved to align with and to be connected to lead connector 27. Note that drain connector 27 is at the potential of pad 23.

Figure 6:
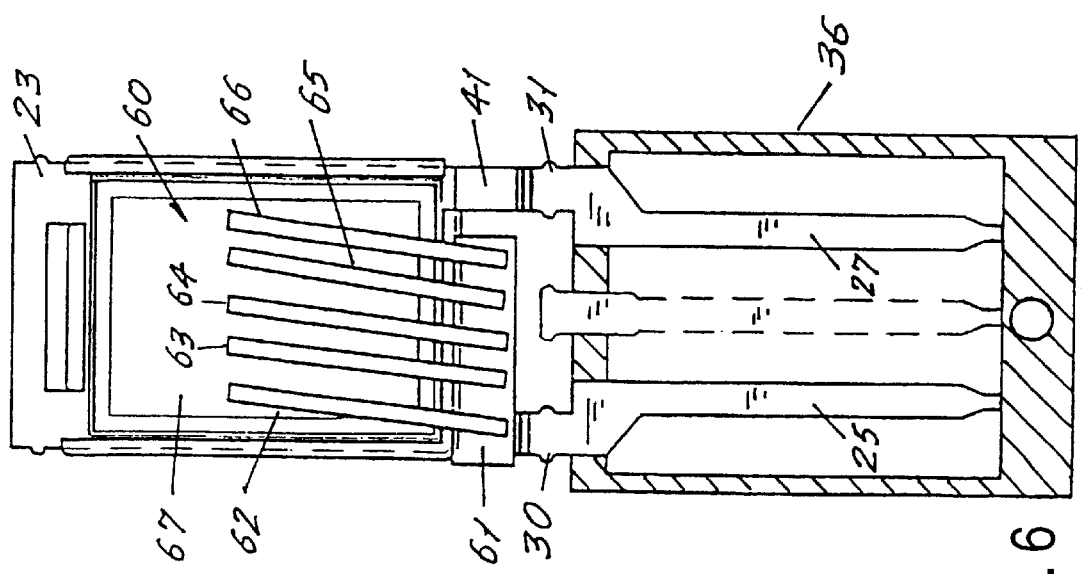
FIG. 6 shows a third embodiment of the invention in which the lead frame section of FIG. 5 is modified for a diode die.

FIG. 6 shows the novel lead frame for a diode die 60, rather than a MOSFET die 22. Thus, in FIG. 6, a diode has a bottom electrode bonded to pad 23. The wire bond posts are modified to merge together posts 50 and 56 of FIG. 5 into a single large area post 61. Post 61 enables the use of 5 bonding wires 62, 63, 64, 65 and 66 from the diode top electrode 67. The metal of the central conductor is stripped away during the metal stripping operation following plastic encapsulation.

Figure 7:
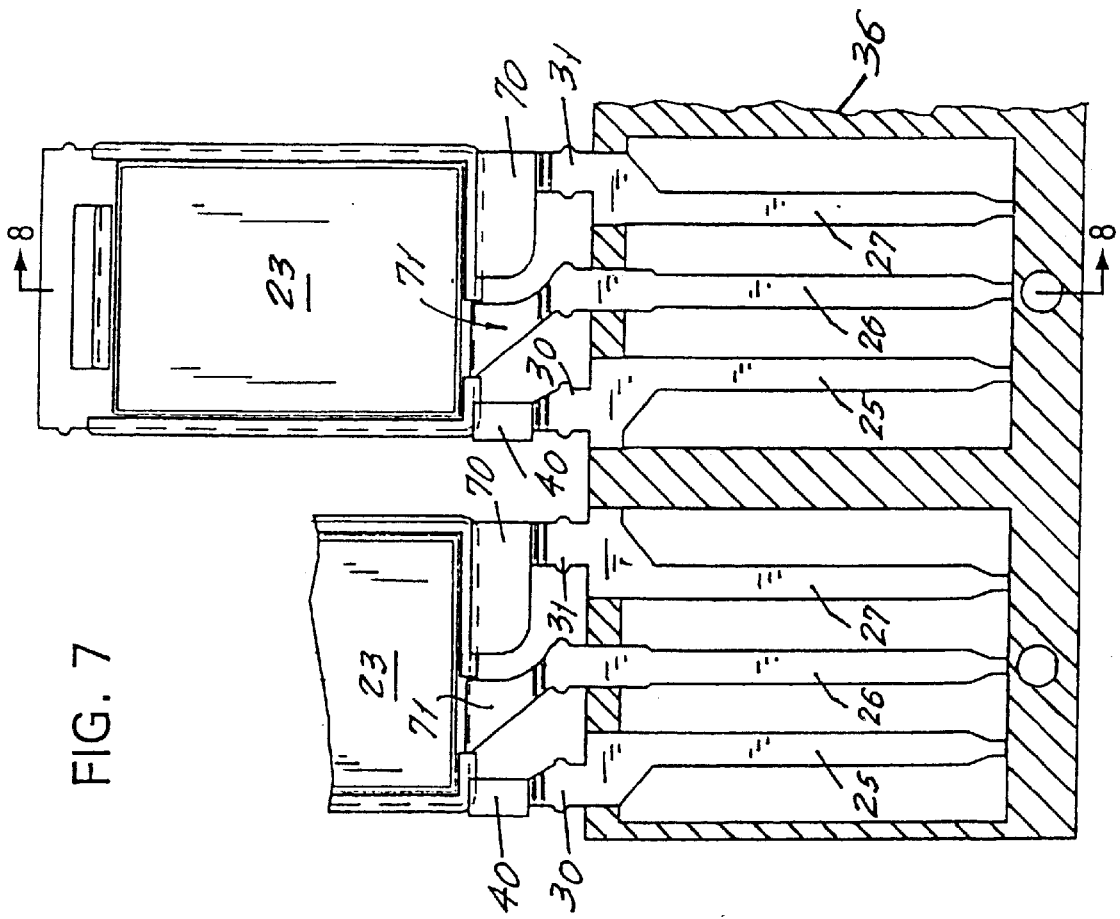
FIG. 7 shows a fourth embodiment of the invention and is a modification of FIG. 4 to increase the source post area.
Figure 8:
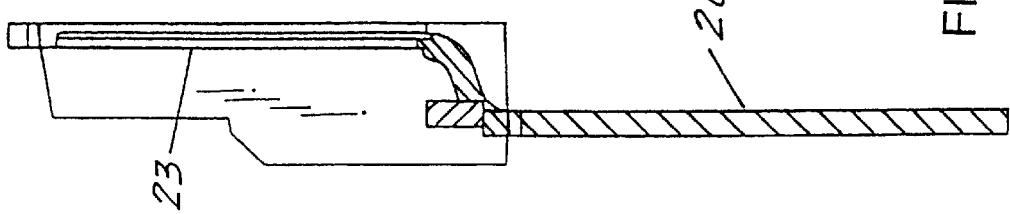
FIG. 8 is a cross-section of FIG. 7, taken across section line 8—8 of FIG. 7.

FIGS. 7 and 8 show a further embodiment of a lead frame (two sections are shown), using the lead sequence of FIG. 4, in which the post 42 of FIG. 4 is modified (enlarged) to allow 3 bonding wires to bond the upper electrode of a die on pad 23 to the post 70. Significantly, post 70 has a width which is close to about one-half the width of the lead frame. Note that pad 23 has a narrowed and curved extension 71 connected to exterior conductor 26 (a drain conductor).

Figure 11:
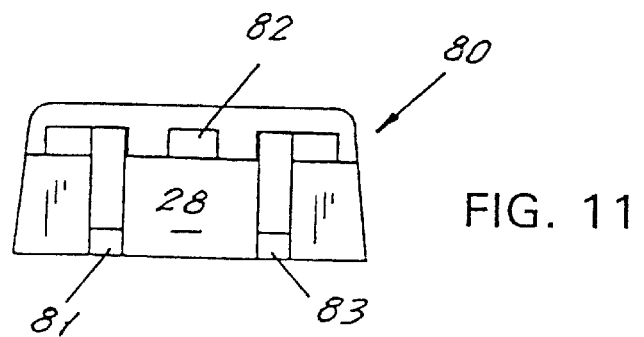
FIG. 11 is an end view of FIG. 9.
Figure 9:
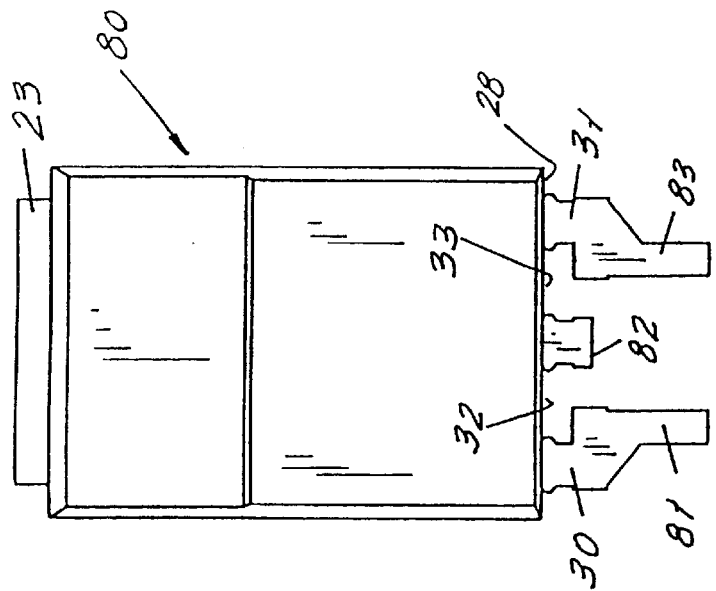
FIG. 9 is a top view of a further embodiment of the invention, modified to be a surface mount type package.
Figure 10:
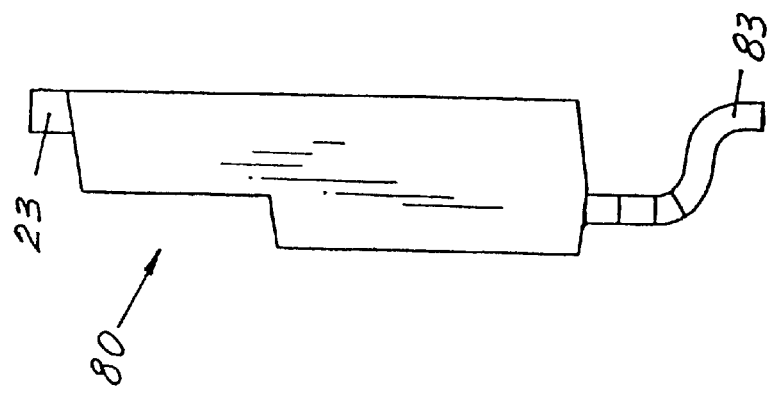
FIG. 10 is a side view of FIG. 9.

FIGS. 9, 10 and 11 show a modification of package 20 of FIGS. 1, 2 and 3 to create a surface mount type package. Thus, plastic package 80 is provided with a lead frame which, like those of the preceding figures, has a main die support pad 23 and three output extending lead conductors 81, 82 and 83. Conductors 81, 82 and 83 may be gate, drain and source conductors respectively, and may have the basic structure of that of FIG. 4 or 7. However, the leads 81 and 83 are reentrantly bent downward as shown in FIGS. 10 and 11 to lie in a plane parallel to the plane of the exposed bottom surface of pad 23. Thus, the device of FIGS. 9 to 11 is adapted for surface mounting, and otherwise has the various advantages previously described for FIGS. 4 and 7.

Figure 12:
FIG. 12 is a cross-section of a lead frame conductor of a standard TO220 package for a 50 ampere rating.

FIG. 12 shows a cross-section of any of the lead conductors 25 to 27 of FIGS. 1 to 3. In the prior art TO220 package, the conductor 25 had a height of about 0.8 mm and a width of about 0.46 mm giving a cross-section area of about 0.388 mm$^2$. This was used for devices rated at about 50 amperes RMS and required a printed circuit board hole of about 0.92 mm diameter.

Figure 13:

It was found that the use of added bond wires within the package, as in FIG. 5, enabled an increase in device current. Thus, as shown in FIG. 13, the cross-section of contact 25 can be made 0.8 mm×0.8 mm for a cross-section of 0.64 mm$^2$. This requires only a minor increase in board hole diameter to 1.15 mm, but permits an increased current capacity to 65 amperes RMS without added temperature rise or increased package resistance.

Figure 14:
FIGS. 13 and 14 are cross sections of improved lead frame conductors made in accordance with the invention and having a higher current capacity.

Further, as shown in FIG. 14, an increase of board hole diameter to 1.27 mm enable a contact cross-section of 0.8 mm×1.0 mm, increasing its current capacity to about 80 amperes RMS.

Figure 15:
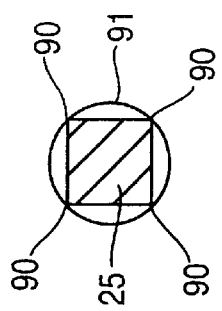
FIG. 15 is a cross-section of an improved lead frame conductor made in accordance with the invention in which the edges of the rectangular conductors are chamfered to enable the use of a larger conductor cross-section without an excessive increase in the circuit board hole diameter.

FIG. 15 shows the use of chamfered edges 90 on rectangular conductor 25. This permits the use of an increased copper cross-section of conductor 25 without a change in the thru-opening 91 in a circuit board.

Figure 16:
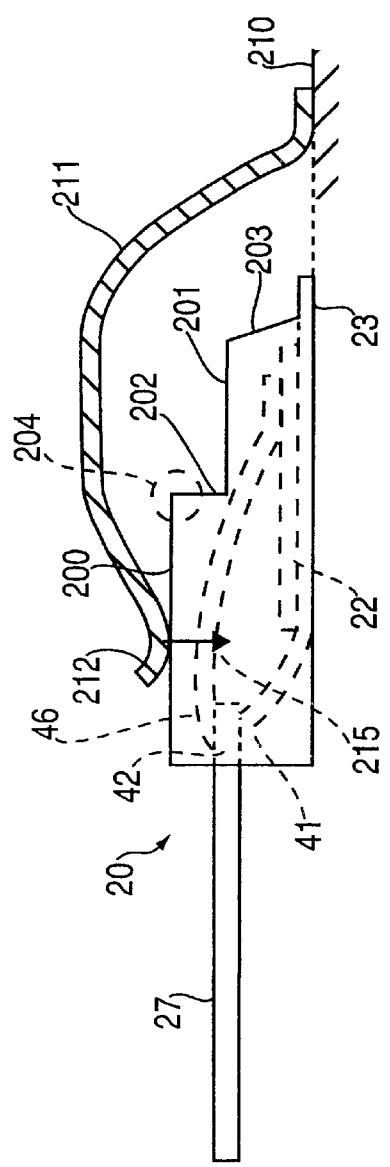
FIG. 16 is a side view of the package outline of a prior art device with mounting spring.

FIG. 16 shows the outline used for the plastic housing, such as that of a TO220 outline or the like. As in the case of the package of FIGS. 1 to 10, the package 20 (shown with the lead frame of the invention) has a relatively thick region with a flat shelf 200, a relatively thin region with a flat shelf 201 and vertical or near-vertical walls 202 and 203. The wall 202 intersects top surface 200 at almost 90°. this has created a molding problem in which air bubbles become entrapped in edge region 204. Furthermore, the package 20 is frequently surface mounted atop a circuit board 210 or other surface by a cantilevered spring 211 which is fixed at one of its ends to the support surface 210. Spring 211 may have an upturned end edge 212, which also defines a pressure point to apply pressure to the top surface 200 to press package 20 against the support surface.

In the prior art package design, the pressure point 215 is removed toward an edge of die 22. It is preferable, in order to reduce contact resistance between frame 23 and surface 210 and to better distribute stress over the area of die 22, to move the point of pressure application toward the center of die 22.

A further problem with the package of FIG. 16 is that the edge of the package where wall 202 intersects surface 201 is low, and reduces the tolerance in the bend of lead wire 46.

Figure 17:
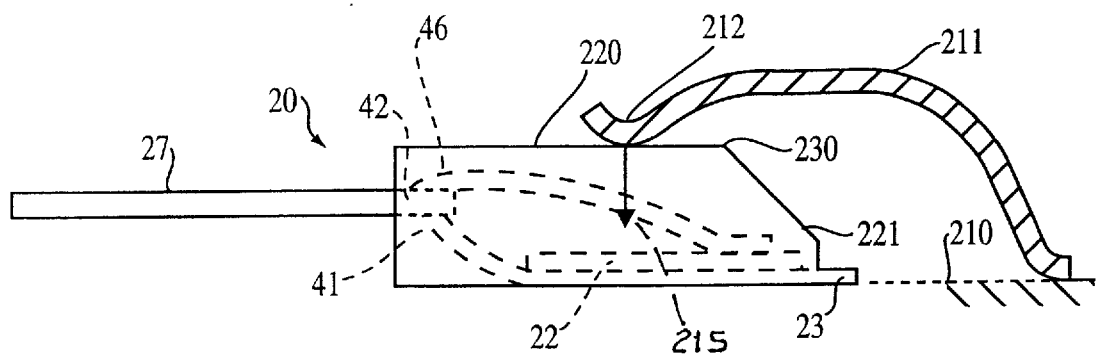
FIG. 17 is a side view of a novel package outline in accordance with the invention with a mounting spring.
Figure 18:
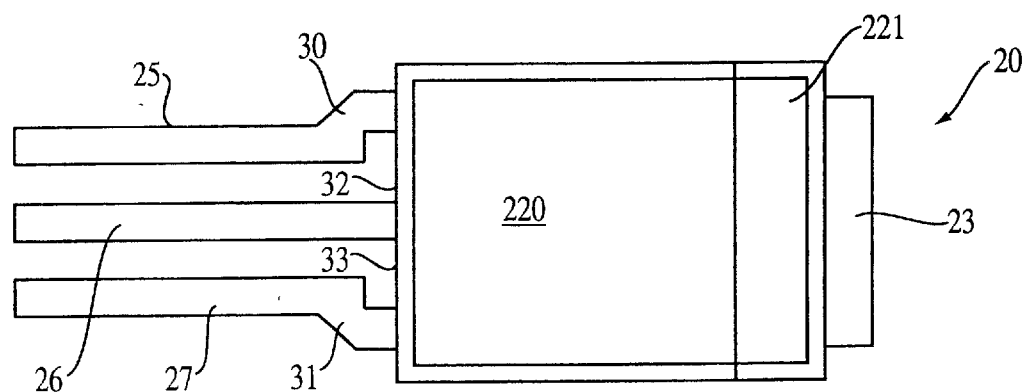
FIG. 18 is a top view of the package of FIG. 17.

In accordance with the present invention, the package outline is changed as shown particularly in FIGS. 17 and 18. Thus, in FIGS. 17 and 18, the flat top surface 220 is extended well beyond the center of die 22, and end wall 221 forms an angle of about 45° to the vertical. Consequently, the pressure point 215 of spring 211 is applied over the center of die 22 to improve the mounting of package 20 to surface 210, both electrically and mechanically.

Furthermore, the novel wedge shape of the end of package 20 of FIGS. 17 and 18 enable its mounting in spring 211, simply by pressing the package 20 to the right in the figures, thus coming up the end 212 of spring 211 and moving the package 20 under spring 211 to its desired position. A notch, or positioning posts not shown, can be formed in the package 20 to locate the package 20 in its desired end position.

A further advantage of the package outline of FIGS. 17 and 18 is that the edge 230 will not entrap air during molding. Furthermore, additional room is provided for lead 46 and other similar leads without fear of their coming too close to a shallow shelf as in FIG. 16. Note that in the package of FIGS. 1 to 10, that a short chamfer is found on the edge equivalent to edge 202 in FIG. 16, to prevent the formation of bubbles in that edge during molding.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device of increased current capacity without an increased size; said semiconductor device comprising a semiconductor device die; a plurality of bonding wires; a die mounting pad and a plurality of parallel spaced external conductors; at least one of said parallel spaced external conductors having a first bond wire post at one end thereof; the bottom of said die being fixed to the top surface of said die mounting pad; a plurality of said bonding wires being bonded at one end thereof to the top surface of said die and at the other end thereof to said bond wire post; a plastic housing for enclosing said die; said plurality of spaced conductors extending from the interior of said plastic housing, through a side wall of said housing to the exterior of said housing; the laterally outermost two of said plurality of spaced external conductors being reentrantly bent and penetrating said side wall of said housing so that said laterally outermost two conductors will have a greater spacing at said side wall than at their free ends thereby increasing the creepage distance along the surface of said side wall.

2. The device of claim 1 wherein said first bond wire post has a width which is at least about one-half the width of said side wall.

3. The device of claim 2 wherein a second one of said external conductors has a second bond wire post for connection to a control electrode on the top surface of said die; said first bond wire post having one area substantially greater than that of said second bond wire post.

4. The device of claim 1 wherein said die mounting pad is electrically connected to one of said external conductors.

5. The device of claim 1 in which said bond wire post is fixed to a conductor which serves as a power node and has a width of at least about one-half the width of said side wall.

* * * * *